United States Patent [19]
Altemus et al.

[11] 3,986,251
[45] Oct. 19, 1976

[54] GERMANIUM DOPED LIGHT EMITTING DIODE BONDING PROCESS

[75] Inventors: Raymond L. Altemus; Richard T. Gill, both of Scottsdale, Ariz.

[73] Assignee: Motorola, Inc., Chicago, Ill.

[22] Filed: Oct. 3, 1974

[21] Appl. No.: 511,879

[52] U.S. Cl. .................................. 29/590; 29/577; 228/123; 228/179; 357/67
[51] Int. Cl.² ................ H01L 25/00; H01L 27/15; H01L 21/225
[58] Field of Search ............ 29/590, 577, 589, 583, 29/588, 626, 199; 357/66, 67; 148/23, 24, 27, 177, 180, 181, 127; 228/122, 123, 124, 179, 193, 194, 195, 196, 203, 208, 229, 226, 219, 220, 227, 228, 238; 427/50, 51, 88, 89, 91, 93, 99, 250, 427/404, 380, 258

[56] References Cited
UNITED STATES PATENTS

| | | | |
|---|---|---|---|
| 3,460,241 | 8/1969 | Ehrenberg | 357/67 X |
| 3,484,933 | 12/1969 | Hagon | 29/577 |
| 3,609,472 | 9/1971 | Bailey | 29/589 X |
| 3,702,290 | 11/1972 | Yu et al. | 357/67 X |
| 3,702,787 | 11/1972 | Lowry et al. | 427/91 X |
| 3,711,745 | 1/1973 | Moroney | 357/67 X |
| 3,716,907 | 2/1973 | Anderson | 357/67 X |
| 3,729,807 | 5/1973 | Fujiwara | 228/123 X |

*Primary Examiner*—Victor A. DiPalma
*Attorney, Agent, or Firm*—Harry M. Weiss; Kenneth R. Stevens

[57] ABSTRACT

A method for bonding a gallium-type light emitting diode (LED) to a metallized substrate interconnection member, such as, a header, or a strip. An LED wafer is subjected to premetallizing backside processing in order to prepare the surface for a metallizing deposition step. During metallization, the backside wafer is deposited with a gold-germanium or gold-silicon alloy. Thereafter, the wafer is heated in forming gas in order to alloy the gold-germanium or gold-silicon first layer to the wafer backside. Then, a second layer of gold-germanium or gold-silicon is evaporated over the alloyed first layer. The LED chip or die is then eutectically die bonded to a metallized substrate.

11 Claims, 3 Drawing Figures

GERMANIUM DOPED LIGHT EMITTING DIODE BONDING PROCESS

BACKGROUND OF THE INVENTION

1. Field of the Invention

This invention relates to a semiconductor bonding process, and more particularly to a method for eutectically die bonding gallium-type light emitting diodes to a metallized substrate or interconnection member.

2. Description of the Prior Art

It is necessary to obtain mechanical strength, good heat transfer capability and an extremely low ohmic resistance contact in bonding a light emitting diode to an interconnection substrate, such as, a header or strip in order to optimize device performance and reliability. The extremely low resistance ohmic characteristic is necessary as many light emitting diode packaging schemes employ a single lead or connection between the active device and input/output connections, pads, pins, etc. An electrical path between the light emitting diode chip and a metallized substrate completes the circuit and thus only a single lead is required.

Previously, either epoxy die bonding or preform die bonding was used to attach light emitting diodes to metallized members or substrates such as, headers or strips. The epoxy technique generally requires longer overall processing time in addition to the specific cure time inherent in this technique. Further, the epoxy bond does not provide optimal heat transfer between the light emitting diode semiconductor member and its interconnection substrate. Similarly, the preform technique is more expensive and requires longer processing and assembly time. Also, it is yield limited in that often times electrical shorts are created due to the existence of excess metal associated with this process. That is, the use of a preform metal blank for joining the semiconductor light emitting diode chip or die to the interconnection member impedes close quality control of the amount and containment of the metal system.

Therefore, it is an object of the present invention to provide a faster, more economical method of joining gallium-type light emitting semiconductor diode devices to a metallized substrate, interconnection or frame member.

Another object of the present invention is to provide a method of attaching light emitting diode chips to an interconnection member wherein the thermal conductivity between the bonded final package is higher than previously obtainable without sacrifices in cost or time.

Another object of the present invention is to provide a highly efficient economical method of interconnecting a gallium-type LED, i.e., comprising a highly active metal to an interconnection structure with a eutectic bond which possesses excellent mechanical strength, high heat transfer characteristics and low ohmic resistance.

In accordance with the aforementioned objects, the present invention provides a method for eutectically bonding a gallium-type semiconductor-type light emitting diode to an interconnection member by preparing the backside surface of the semiconductor wafer and then evaporating a first alloy layer, such as gold-germanium or gold-silicon, over the back surface. Thereafter, the deposited layer is alloyed at approximately 370° C in forming gas. Next, a second gold-germanium or gold-silicon layer is evaporatively deposited over the first layer. Then, the wafer is separated into separate dies or chips and individual dies are eutectically bonded to a metallized interconnection member or substrate.

DESCRIPTION OF THE PREFERRED EMBODIMENTS

Figure 1:
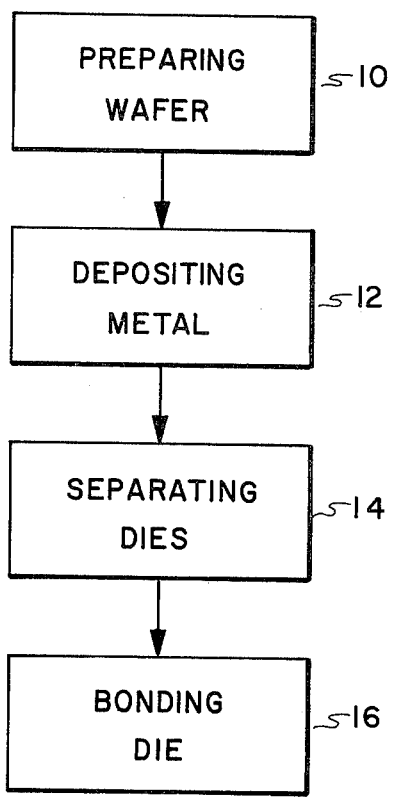
FIG. 1 illustrates the basic method steps for eutectically bonding gallium-type light emitting diodes to an interconnection member.

Now referring to FIG. 1 which illustrates the generalized process steps, specifically at 10 a backside wafer preparation step is performed. Initially, the wafer backside surface is lapped with a suitable abrasive such as a 15 micron grit to a thickness of approximately 5.5 to 7.0 mils. Thereafter, the backside of the wafer is cleaned with a suitable soap solution mixed with warm water. Then, the backside of the wafers are etched in a 3:1:1(3:1:1) (3: $H_2SO_4$ - 1:$H_2O_2$ - 1:$H_2O$) at 50°–60° C for approximately one minute. A suitable solvent cleaning operation and a drying operation are then performed prior to a metal deposition step at 12. These steps help insure that a smooth metal deposited surface is achieved at 12.

At 12 the backside of the wafer is deposited with a metal layer approximately 4000A thick. Conventional evaporative equipment is suitable for depositing an alloy layer consisting of gold-germanium or gold-silicon on the backside of the wafer. In the preferred embodiment a gold-germanium alloy is employed. The alloy consists of gold and 13% by weight germanium. Thicknesses under 4000A do not yield the best results while thicknesses over 4000A do not deleteriously affect the method of the present invention aside from the obvious economical considerations. Thereafter, the initial layer is alloyed at approximately 370° C for 20 minutes in a forming gas. Finally, another gold-germanium or gold-silicon layer, again gold-germanium being the preferred embodiment and containing 13% by weight germanium, is evaporated on the backside of the wafer after the alloying step in forming gas.

In order to assure high quality, reliable eutectic bonds between the gallium-type light emitting diode devices, it is critical that the specific sequential steps detailed at 12 be followed. Gallium is an extremely volatile or active metal and therefore it is necessary to intitially deposit the first layer of gold-germanium or gold-silicon followed by the alloying step in order to obtain proper adhesion and to minimize gallium out gassing and oxide formation prior to the deposition of the final gold alloy layer. Light emitting diodes formed on a gallium arsenide, gallium arsenide phosphide, or gallium phosphide material often used in the formation of light emitting diodes all exhibit the same problem of out gassing of the active gallium metal during metal alloy deposition.

At step 14, the individual dies or chips are separated from the wafer by any suitable subtractive removal process such as etching, scribing, laser or electron beam thermal machining.

Figure 2:
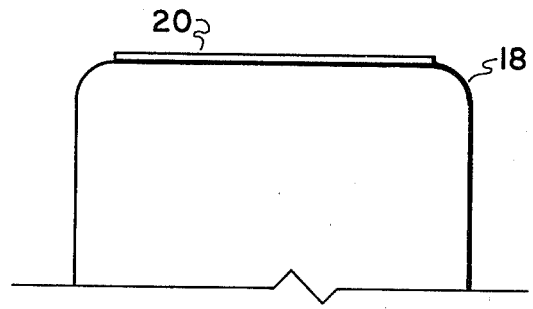
FIGS. 2 and 3 are diagrammatic structural representations of a metallized interconnection substrate and metallized substrate having a light emitting chip joined thereto, respectively.

Finally at 16, the individual dies or chips are placed on a metallized interconnection member such as a strip or header and eutectically bonded to a metallized film deposited over the interconnection member. As illustrated in FIG. 2 the metallized substrate or header or strip is diagrammatically depicted at 18 and carries a metallized layer 20. In the preferred embodiment the metal layer 20 comprises a gold layer of between 10,000A to 12,000A thick. Again, this is a minimum dimension and a greater thickness is possible aside from the economical considerations. In order to achieve a high quality bond however it is important that the upper surface of the metallized layer 20 as well as the evaporated metallurgical system deposited on the semiconductor chips or dies by steps 10 and 12 be as smooth as possible.

Figure 3:
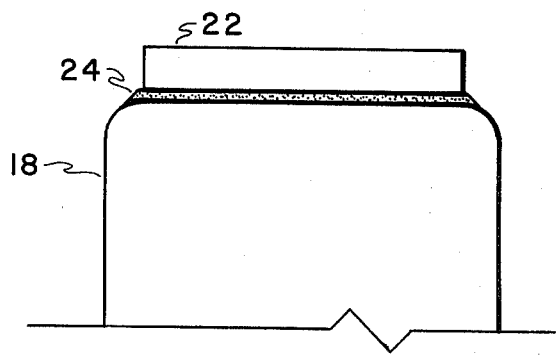

As illustrated in FIG. 3, a gallium-type light emitting diode semiconductor chip 22 having a backside metallized layer or system deposited in accordance with the steps of FIG. 1 is eutectically bonded to an interconnection member 18 by means of a eutectic metallurgical bond 24. In the preferred embodiment the eutectic bonding operation is performed in an ambient atmosphere at a temperature of approximately 500° C.

Although layer 20 in the preferred embodiment is gold, it is expected that other suitable metals such as silver, silver palladium, nickel, platinum, ruthenium would also be suitable metals.

The preferred embodiment utilizes the present method for light-emitting diodes, however, it is expected that other active devices, i.e., field effect devices, rectifiers, and high power active devices, manufactured from gallium-type III-V compounds would also advantageously employ the present bonding process. The backside wafer preparation step may also be suitably implanted by a mechanical lapping process as opposed to the chemical etch of the preferred embodiment.

What is claimed is:

1. A method of bonding a semiconductor device to a metallized substrate having a high heat transfer, low ohmic and high stress metallurgical bond comprising the steps of:
   a. preparing the back side of a semiconductor wafer for forming a back side wafer surface capable of accepting a first metal layer;
   b. evaporating a first metal layer of predetermined thickness over the back side wafer surface;
   c. heating said first layer in a predetermined non-vacuum gaseous ambient for alloying said first layer to said wafer for forming a low resistance ohmic contact between said first layer and said back side wafer surface, and
   d. evaporating a second metal layer of a predetermined thickness selected from the group consisting of gold germanium, gold silicon for forming a processed wafer having a back side metallurgical system capable of being eutectically bonded.

2. A method of bonding a semiconductor device to a metallized substrate with a high heat transfer, low ohmic resistance and high strength metallurgical bond as in claim 1 wherein:
   a. said evaporating step includes the step of depositing said first metal layer selected from a group consisting of gold germanium, gold silicon over the back side wafer surface.

3. A method of bonding a semiconductor device to a metallized substrate with a high heat transfer, low ohmic resistance and high stress metallurgical bond as in claim 2 further including the step of:
   a. joining a semiconductor device removed from said processed wafer to the metallized substrate by bonding eutectically the semiconductor device portion of said back side metallurgical system to said metallized substrate.

4. A method of bonding a semiconductor device to a metallized substrate with a high heat transfer, low ohmic resistance and high stress metallurgical bond as in claim 2 wherein:
   a. the preparing step comprises the step of polishing the back side of said semiconductor wafer for reducing surface area on the back side of the said semiconductor wafer.

5. A method of bonding a semiconductor device to a metallized substrate with a high heat transfer, low ohmic resistance and high stress metallurgical bond as in claim 4 further comprising the step of:
   a. heating said first metal layer in forming gas at a temperature of approximately 370° C.

6. A method of bonding a semiconductor device to a metallized substrate with a high heat transfer, low ohmic resistance and high stress metallurgical bond as in claim 5 further including the step of:
   a. selecting a gallium arsenide, gallium arsenide phosphide, or gallium phosphide type semiconductor wafer and forming a plurality of active metal-type light emitting diodes therein prior to joining semiconductor devices removed from the processed wafer.

7. A method of bonding a semiconductor device to a metallized substrate with a high heat transfer, low ohmic resistance and high stress metallurgical bond as in claim 6 further comprising the step of:
   a. evaporating said first metal layer to a thickness of approximately 4,000 angstroms or greater.

8. A method of bonding a semiconductor device to a metallized substrate with a high heat transfer, low ohmic resistance and high stress metallurgical bond as in claim 7 further comprising the step of:
   a. evaporating said second metal layer to a thickness of approximately 4,000 angstroms or greater.

9. A method of bonding a semiconductor device to a metallized substrate with a high heat transfer, low ohmic resistance and high stress metallurgical bond as in claim 8 further including the step of:
   a. depositing a gold layer for forming said metallized substrate.

10. A method of bonding a semiconductor device to a metallized substrate with a high heat transfer, low ohmic resistance and high stress metallurgical bond as in claim 9 further including the step of:
    a. depositing said gold layer to a thickness in a range of about 10,000 angstroms-12,000 angstroms.

11. A method of bonding a semiconductor device to a metallized substrate with a high heat transfer, low ohmic resistance and high stress metallurgical bond as in claim 10 wherein:
    a. said joining step includes the step of bonding eutectically at a temperature of approximately 500° C.

* * * * *